(12) United States Patent
Buckler

(10) Patent No.: US 9,344,099 B2
(45) Date of Patent: May 17, 2016

(54) CONTINUOUS FREQUENCY MEASUREMENT FOR PREDICTIVE PERIODIC SYNCHRONIZATION

(71) Applicant: ADVANCED MICRO DEVICES, INC., Sunnyvale, CA (US)

(72) Inventor: Mark Buckler, Acton, MA (US)

(73) Assignee: Advanced Micro Devices Inc., Sunnyvale, CA (US)

(*) Notice: Subject to any disclaimer, the term of this patent is extended or adjusted under 35 U.S.C. 154(b) by 162 days.

(21) Appl. No.: 14/061,529

(22) Filed: Oct. 23, 2013

(65) Prior Publication Data

US 2015/0109028 A1    Apr. 23, 2015

(51) Int. Cl.
| | | |
|---|---|---|
| *G01R 25/00* | (2006.01) | |
| *H03D 13/00* | (2006.01) | |
| *H03L 7/193* | (2006.01) | |
| *H03L 7/091* | (2006.01) | |
| *H03L 7/087* | (2006.01) | |

(52) U.S. Cl.
CPC ............... *H03L 7/193* (2013.01); *H03L 7/087* (2013.01); *H03L 7/091* (2013.01)

(58) Field of Classification Search
CPC ....... H03D 13/004; H03K 5/26; G01R 25/00; H03L 7/0891; H03L 7/085
USPC ......................................................... 327/2–7
See application file for complete search history.

(56) References Cited

U.S. PATENT DOCUMENTS 6,864,722 B2   3/2005  Adkisson
8,428,207 B1*  4/2013  Dally et al. ................. 375/355

OTHER PUBLICATIONS

"A Predictive Synchronizer for Periodic Clock Domains", U. Frank, T. Kapshitz, R. Ginosar, © Springer Science + Business Media, LLC 2006, May 3, 2006.
"Understanding Clock Domain Crossing Issues", Saurabh Verma, Ashima S. Dabre, Atrenta, EE Times, http://www.eetimes.com/document.asp?doc_id=1279906, Published Sep. 17, 2012, Retrieved on Sep. 17, 2013, pp. 1-7.
"The Even/Odd Synchronizer: A Fast, All-Digital Periodic Synchronizer", William J. Dally, Stephen G. Tell, Stanford University, NVIDIA Corporation, © 2010 IEEE, pp. 75-84.

* cited by examiner

*Primary Examiner* — Diana J Cheng
(74) *Attorney, Agent, or Firm* — Staniford Tomita LLP

(57) ABSTRACT

Embodiments are described for a method of continuously measuring the ratio of frequencies between the transmit and receive clock domains of a heterochronous system using an array of digital frequency measurement circuits that provide overlapping frequency and detection interval measurements within single counter periods required for a single frequency measurement circuit to complete a frequency measurement. Embodiments may be used in a predictive synchronizer to provide low latency, continuous frequency measurements for system-on-chip (SOC) devices that employ frequency drift or ramping to reduce power consumption and overheating conditions.

16 Claims, 8 Drawing Sheets

CONTINUOUS FREQUENCY MEASUREMENT FOR PREDICTIVE PERIODIC SYNCHRONIZATION

TECHNICAL FIELD

Embodiments relate generally to predictive synchronizers, and more specifically to a continuous frequency measurement system for predictive synchronizers to provide low latency synchronization in systems with dynamic frequency clock domains.

BACKGROUND

Modern system-on-chip (SOC) devices often utilize multiple clocks that produce different clock domains within the same chip. Issues associated with clock domain crossings include metastability, data loss, and data incoherency. Metastability is caused when signal transitions occur close enough to active clock edges such that setup or hold violations cause an output signal to oscillate indefinitely until a later clock signal settles it to a stable value. Systems often utilize synchronizer logic circuits to transmit data between different clock domains (referred to as transmit/receive domains or source/destination domains) to avoid metastability and other problematic timing conditions. Synchronizers generally comprise flip-flop circuits that introduce signal delays to allow oscillations to settle down to produce a stable output at the destination domain.

Predictive synchronizers have been developed that use information about the transmitting and receiving clock domains to decrease both failure rate and data transmission latency. Predictive synchronization is advantageous in that it is low latency (assuming the prediction data is correct) and can completely avoid the chance of metastablity. However, if either clock frequency (receive or transmit) goes outside of an acceptable range due to drift or active ramping then miss-predictions may occur. Such miss-predictions cause a high chance of metastability which breaks any logic connected to the synchronizer and defeats the purpose of the synchronizer. Existing predictive synchronizers have generally used high latency measurement circuits to get the information they need from the transmit and receive clock domains, and these systems expect transmit and receive frequencies to stay within a certain range around the measured value during the entire operation. Existing predictive synchronizers thus require information collected from frequency measurement circuits with high latency. This information is acquired during a measurement state and is not revisited during normal operation, with the system assuming that frequencies will stay within a small range. This means that if either clock frequency (receive or transmit) goes outside of the acceptable range due to frequency drift or active ramping then miss-predictions will occur and cause a high chance of metastability.

Although current predictive synchronizer designs perform satisfactorily when used with static frequency devices, many SOC devices purposely utilize frequency drift or frequency ramping within one or more domains to enhance certain performance or operating characteristics. For example, active frequency ramping (up or down) occurs in a number of SOCs and is a key mechanism in devices that feature dynamic frequency scaling (DFS) or dynamic voltage scaling (DVS) whereby performance or power consumption of the device is reduced based on work load or operational characteristics to save power or reduce the amount of heat generated by the device. Present predictive synchronizer circuits are of limited usefulness in such SOC devices because of their inability to efficiently accommodate dynamic frequency changes in different clock domains.

A particular predictive synchronizer has been developed for periodic clock domains in which two versions of data are latched and selected according to the output of a phase comparator that compares the two clocks (i.e., the transmit domain and receive domain clocks). As stated above, such a circuit requires advanced knowledge of the transmit and receive frequencies and is non-adaptive with respect to changing or ramping frequencies. Certain other predictive synchronizers have been developed that accommodate variable frequencies, however such systems generally do not provide continuous frequency measurement and uninterrupted synchronization. What is needed, therefore, is a method of continuous frequency measurement in disparate clock domains of an SOC device that allows data to be transferred without interruption while clock frequencies drift or even ramp up and down.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY OF EMBODIMENTS

Some embodiments are described for a method of continuously measuring frequencies in different clock domains of a heterochronous system by measuring a ratio of the frequency of a transmit clock domain to a receive clock domain over a number of clock cycles defining a first measurement period, and measuring a ratio of the frequency of the transmit clock domain to the receive clock domain over a number of clock cycles defining at least one or more subsequent measurement periods, wherein the cycle length of the first measurement period is equal to each of the subsequent measurement periods, and wherein each of the at least one or more subsequent measurement periods is started within the first measurement period. The method further comprises continuously measuring the ratio of the frequency over a plurality of measurement periods and subsequent measurement periods over an overall time period to provide continuous frequency updates of the ratio of the transmit clock domain frequency to the receive clock domain frequency. The continuous frequency updates are provided to a periodic synchronizer for synchronization of data transferred from the transmit clock domain to the receive clock domain. The number of subsequent measurement periods is an integer number n, and wherein each subsequent measurement period is started within the first measurement period at an interval separated by 1/n clock cycles.

In an embodiment, two frequency measurement circuits are used. In this case, the method comprises taking a first frequency measurement at a beginning of a measurement cycle, the first frequency measurement comprising a ratio of the transmit clock domain frequency to the receive clock domain frequency, taking a second frequency measurement at approximately half the measurement cycle, the second frequency measurement comprising a ratio of the transmit clock domain frequency to the receive clock domain frequency, and repeating the first and second frequency measurements for subsequent measurement cycles to provide continuous updates of the ratio of the transmit clock domain frequency to the receive clock domain frequency for each subsequent frequency measurement time. The method may further comprise maintaining a receive counter to count clock cycles for the receive clock domain, asserting a first done signal upon overflow of the receive counter, wherein an asserted first done signal indicates a completion of the measurement cycle for the receive clock domain, maintaining a transmit counter to count clock cycles for the transmit clock domain, and asserting a second done signal upon overflow of the receive counter, wherein an asserted second done signal indicates a completion of the measurement cycle for the transmit clock domain.

The method may further comprise providing the continuous updates of the ratio of the transmit clock domain frequency to the receive clock domain frequency as a sequential plurality of frequency values to a phase estimator circuit in conjunction with a plurality of continuously updated detection interval measurement values, wherein each detection interval measurement value comprises a time delay used in a phase detection circuit in terms of the transmit clock domain frequency. Even and odd edge detection values may be provided to a phase estimator circuit, wherein the phase estimator circuit derives an estimated phase of the transmit clock. The estimated phase of the transmit clock and data transmitted from the transmit clock domain may then be processed in an even/odd synchronizer to generate receive data synchronized to the receive clock domain frequency.

Some embodiments are directed to an apparatus or system comprising one or more processing elements that perform the acts or process steps of the two methods described above.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Figure 1:
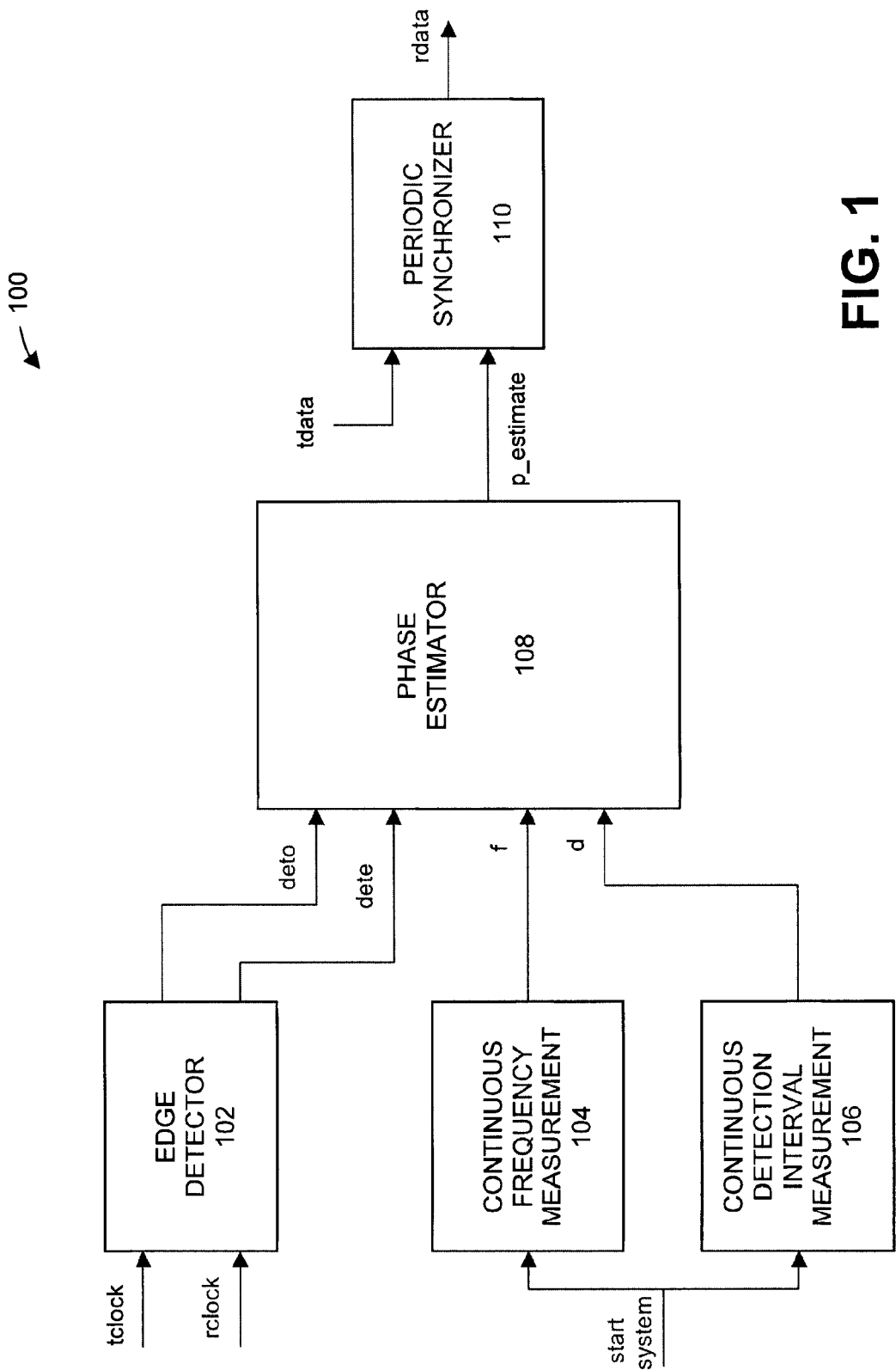
FIG. 1 is a block diagram of a continuous frequency measurement periodic synchronizer, under some embodiments.

Embodiments are generally directed to a system and method for providing continuous frequency measurement for predictive periodic synchronizers used in SOC and similar devices that feature different clock domains with frequencies that may drift or ramp within each domain. Frequency and detection interval measurements are continuously updated using a series of measurement circuits and dynamically scalable counters to provide recent relevant frequency data regarding the transmit and receive domains of the SOC for use by a periodic synchronizer to provide low latency synchronization for data transfers between the two domains.

Any of the embodiments described herein may be used alone or together with one another in any combination. The one or more implementations encompassed within this specification may also include embodiments that are only partially mentioned or alluded to or are not mentioned or alluded to at all in this description or in the abstract. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Embodiments include a continuous frequency measurement mechanism for use with predictive synchronizers. In a non-dynamic predictive synchronizer, information regarding transmit and receive frequencies in heterochronous or periodic domains is generally supplied by a measurement circuit that is used only once during startup of the system. This synchronizer requires a measured value of the ratio between the transmit clock (tclock or tclk) frequency and the receive clock (rclock or rclk) frequency ($f=f_t/f_r$) as well as the time delay used in the phase detection circuit in terms of the transmit clock frequency ($d=t_d/t_{tcy}$). A heterochronous system is generally one in which the transmit and receive clock domains operate at nominally different clock frequencies. The frequencies may differ from each other by a defined minimum frequency value based on operating characteristics of the two domains, or they may be defined by a central or common timing circuit. The differences may range from fractions to multiples of either frequency. Since the measurement circuit requires many clock cycles to wait for large counters to overflow, the measurement process takes a long time. For example, in present systems the measurement time standard is typically 1024 cycles long. This latency would be incurred every time the transmit or receive clock frequencies drift or ramp outside of the acceptable range since the frequency ratio and time delay need to be re-measured. A current solution to this problem in known systems is to switch to a brute force (therefore high-latency) synchronizer when clock frequencies leave the measured range. This is generally impractical in the likely situation that clock frequencies settle at values previously not measured or in which the clock frequencies in either or both domains continuously ramp up or down between different values. In these situations, the circuit will have no choice but to continue using the brute force synchronizer and will never benefit from the low latency predictive synchronization.

Although embodiments are described with respect to heterochronous timing domains, it should be noted that embodiments may be applied to any system in which synchronization between two circuits operating at different frequencies is required, and in which the frequency in either or both circuits may vary or drift over time. A heterochronous or periodic system is generally one in which the transmit and receive clock domains operate at nominally different clock frequencies. The frequencies may differ from each other by a defined minimum frequency value based on operating characteristics of the two domains, or the two frequencies may be set by individual timing circuits or a common timing circuit that generates different timing domains through the use of dividers, multipliers, or other logic circuits.

Embodiments include a mechanism that removes the need for a re-measure state in predictive synchronizers. A continuous measurement system always supplies relevant or reasonably relevant (up-to-date) data for situations when clock frequencies drift or are actively ramped. This allows measurement latency to be completely unseen by the transmitter or receiver, and therefore allows uninterrupted data transfer between two domains during frequency changes within either domain.

Figure 2:
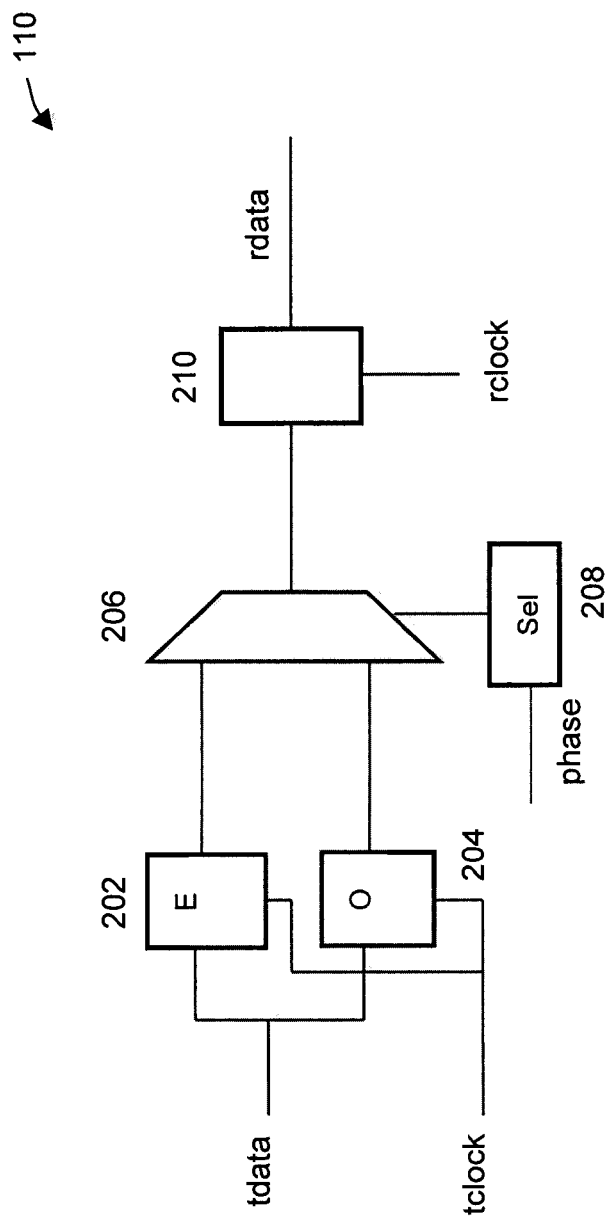
FIG. 2 illustrates an even/odd periodic synchronizer that may be used with embodiments of a continuous measurement synchronizer, under some embodiments.

FIG. 1 illustrates a predictive synchronizer system that implements continuous frequency and detection interval measurement circuits, under some embodiments. System 100 of FIG. 1 comprises an edge detector (also referred to as a phase detection unit) 102 coupled to a phase estimator 108 that provides an estimate of the transmit clock phase to a periodic synchronizer 110. In an embodiment, the periodic synchronizer 110 may be implemented as an even/odd synchronizer that transmits a data signal from the transmit clock domain to the receive clock domain. FIG. 2 illustrates an even/odd periodic synchronizer that may be used with embodiments of a continuous measurement synchronizer system 100, under some embodiments. The periodic synchronizer 110 shown in FIG. 2 writes the transmit data (tdata) alternately to a pair of registers 202 and 204, denoted even (E) and odd (O), respectively. An even or odd control signal coupled to both registers causes the data to be written to the even register 202 on even transmit clock (tclock) cycles and to the odd register 204 on odd tclock cycles. A multiplexer 206 and selection circuit 208 allows the receiver to select the most recently written register that is safe to sample at the end of the current receive clock (rclock) cycle. This selection is based on the predicted tclock phase at the end of the current rclock phase input to the selection circuit 208. The selected data is then output from latch 206 as receive data (rdata) synchronized to the receive clock rclock. It should be noted that the even/odd synchronizer circuit 110 illustrated in FIG. 2 is one example of a periodic synchronizer that can be used in conjunction with embodiments of the continuous frequency measurement system 100, and other types and implementations of periodic synchronizers may also be used.

In an embodiment, the tclock phase provided to the selection circuit 208 is not known absolutely, but is instead estimated using phase estimator 108. Thus, as shown in FIGS. 1 and 2, the phase information provided to the periodic synchronizer corresponds to the phase estimate (p_estimate) signal output from the phase estimator 108. For the system shown in FIG. 1, the phase estimator generates an estimated transmit clock phase based on even and odd edge detections (dete, deto) from an edge detector component 102 and continuous frequency measurements (f) and detection interval measurements (d) from components 104 and 106, respectively. In an embodiment, the edge detector 102 is a circuit that is configured to detect when a transition on a transmit data signal falls within a defined time window around the receive clock (rclock) edge. The circuit may comprise a suitable arrangement of flip-flop and logic circuits to sample delayed tclock and rclock signals to generate early and late samples that are synchronized to the receive clock domain by one or more synchronizer circuits. Differences between early and late circuits are detected by logic circuits that generate appropriate edge detection signals. For the embodiment of FIG. 1, if the early sample is high and the late sample is low, an even edge of tclock is detected and the dete (even detection) signal is asserted. Conversely, if the early sample is low and the late sample is high, an odd edge of tclock is detected and the deto (odd detection) signal is asserted.

The phase estimator circuit 108 may be implemented through a circuit configured to produce lower and upper bound estimates of the tclock phase. When the phase estimates are valid, the transmitter phase is known to be within the interval defined by these upper and lower bound estimates. In operation, the phase estimator receives the edge detection information from the edge detector 102. On each edge detection, the phase estimates are initialized to an initial value and then advanced in by an appropriate value based on whether an edge is detected or not detected. The system selects the most recent safe register to sample based on the lower bound of the transmit phase and the select circuit 208 samples the even register 202 if the phase is within a defined range, or the odd register 204 if it is not.

As shown in FIG. 1, the phase estimator receives frequency (f) data from a continuous frequency measurement component 104 and detection interval (d) data from a continuous detection interval measurement component 106. These two continuous measurement components supply up-to-date data to the periodic synchronizer 110 for situations when clock frequencies (either tclock or rclock) drift or are actively ramped between different values.

Figure 3:
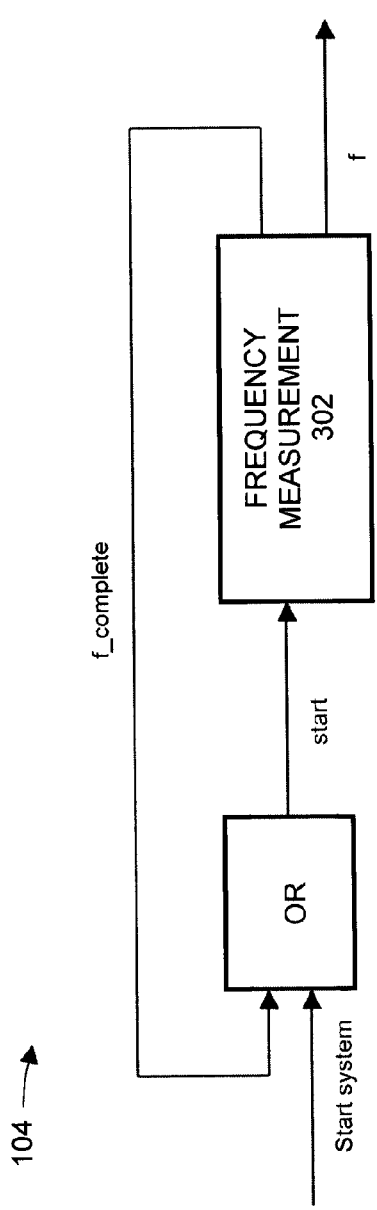
FIG. 3 illustrates a continuous frequency measurement component, under some embodiments.
Figure 4:
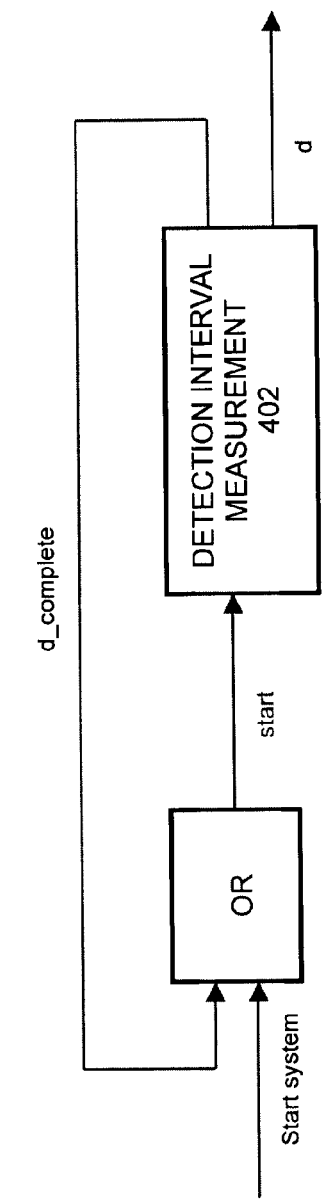
FIG. 4 illustrates a continuous detection interval measurement component, under some embodiments.

FIG. 3 illustrates a continuous frequency measurement component and FIG. 4 illustrates a continuous detective interval measurement component, under some embodiments. Both measurement circuits 104 and 106 operate by monitoring counters connected to receiver clock and transmitter clock signals. When the appropriate respective counter overflows, each circuit outputs a 'complete' or 'done' signal. The continuous frequency measurement circuit 104 of FIG. 3 shows that a 'frequency complete' (f_complete) signal is fed back into the start signal for triggering a frequency measurement circuit 302. This creates a loop where the measurement circuit 302 will restart itself every time it has completed a frequency measurement. FIG. 4 shows the feedback loop for the continuous detection interval measurement circuit 106 wherein a 'detection complete' (d_complete) signal is fed back into the start signal for triggering a detection interval measurement circuit 402.

Figure 5:
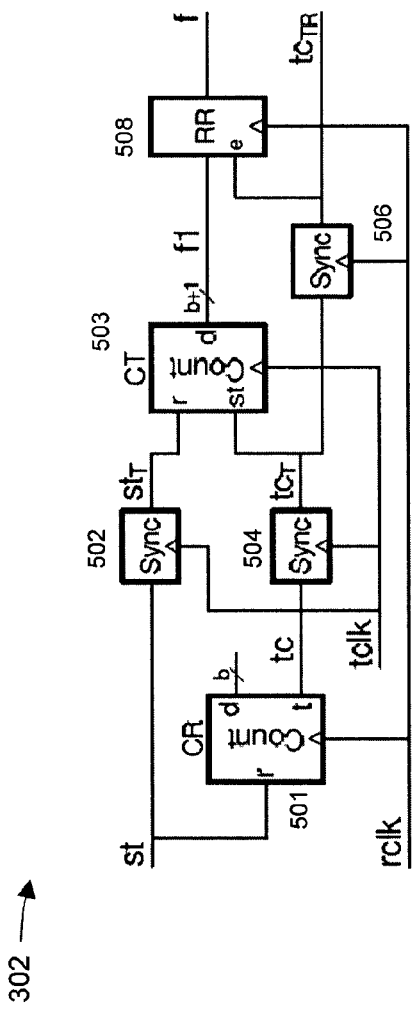
FIG. 5 is a circuit diagram illustrating an example frequency measurement circuit for use in the continuous frequency measurement component, under an example embodiment.

FIG. 5 is a circuit diagram illustrating an example frequency measurement circuit for use in the continuous frequency measurement component 302, under an example embodiment. Circuit 302 includes two counters 501 and 503 denoted receive counter CR and transmit counter CT to compute the frequency (f), which is the frequency of the transmit clock relative to the receive clock. The frequency measurement is initiated by a start signal, st. The rising edge of this signal resets the receive counter and is also passed into the transmit clock (tclk) domain through synchronizer 502 to produce signal $st_T$ which is used to reset the transmit counter 503. When the receive counter reaches a terminal count, signal tc is asserted and is synchronized into the the transmit clock domain. This synchronized terminal count signal, $tc_T$ stops the transmit counter. The terminal count value of the receive counter 501 is configurable based on the size of the counter, thus, for example, a 10-bit counter provides a terminal count of 1023 ($2^b$). The delay of the synchronizers 502 and 504 are balanced so that the final count out of transmit counter 503 reflects the number of transmit clock cycles that occurred during the $2^b$ receive clock cycles. This gives the relative frequency of the transmitter, $f=f_T/f_R$. The terminal count signal is synchronized back into the receive clock domain to produce signal $tc_{TR}$, which is a 'done' signal that indicates when the frequency measurement is ready and enables its capture in result register (RR) 508. In an embodiment, the three synchronizer circuits 502, 504, and 506 are used only when the frequency is measured after a reset, and the delay of these synchronizers may be set relatively high to decrease a probability of synchronization failure.

Figure 6:
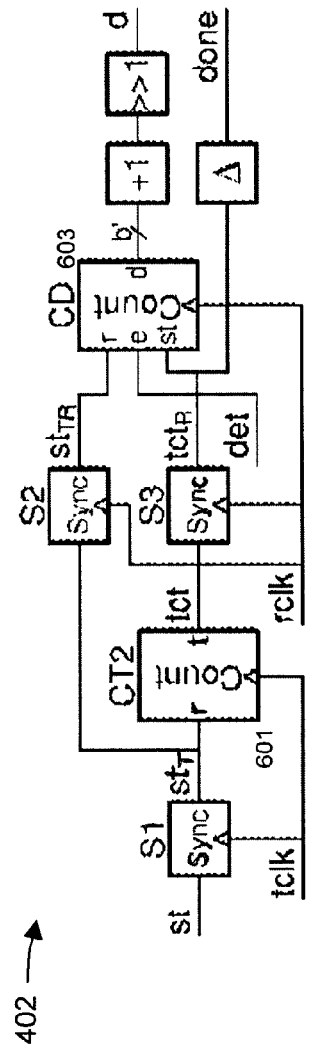
FIG. 6 is a circuit diagram illustrating an example detection interval measurement circuit for use in the continuous detection interval measurement component, under an example embodiment.

FIG. 6 is a circuit diagram illustrating an example detection interval measurement circuit for use in the continuous detection interval measurement component, under an example embodiment. The detection interval measurement circuit 402 includes two counters 601 and 603 denoted second transmit counter CT2 and counter CD. Circuit 402 operates by counting the number of transmit clock cycles during which the det signal is true during the number ($2^{b'}$) of transmit clock cycles it takes for counter 601 to reach its terminal count. The output of counter 603 is incremented to give an upper bound on 2d. Right-shifting this number by one bit position gives d, and the done signal indicates when the measurement of d is complete. In an embodiment, the size of the CR and CD counters in FIGS. 5 and 6 may be the same bit width (b) or they may be of different bit widths (b and b'), as shown.

With reference to FIG. 3, the $tc_{TR}$ signal from frequency measurement circuit 302 comprises an f_complete signal that is fed back to the frequency measurement circuit through a logical OR circuit to be combined with the start signal. Likewise, as shown in FIG. 4, the done signal from detection interval measurement circuit 402 comprises a d_complete signal that is fed back to the detection interval measurement circuit through a logical OR circuit to be combined with the start signal. These feedback loops provide a means of continuous frequency and detection interval measurement.

Figure 7:
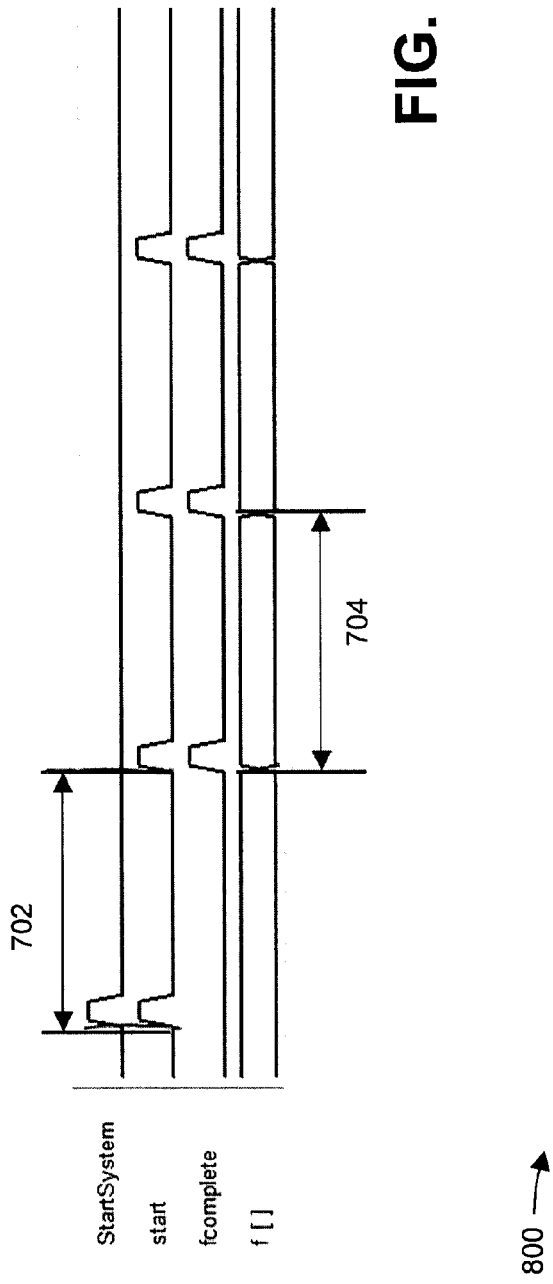
FIG. 7 is a timing diagram illustrating the operation of a continuous frequency measurement circuit, under an embodiment.

FIG. 7 is a timing diagram illustrating the operation of a continuous frequency measurement circuit, under an embodiment. Time interval 702 shows the time it takes until a data transfer can begin, and time interval 704 shows the time in between updates. The timing diagram of FIG. 7 starts with a pulse on the StartSystem line. This asserts the start signal and begins the frequency measurement. Once the circuit completes, the f_complete signal is asserted and the value for f[ ] has been updated. Since the overflowing counter which triggers the complete signal is b-bits wide, this circuit will give updated frequency values every $2^b$ clock cycles. The operation of the continuous detection interval measurement circuit is analogous to that of the continuous frequency measurement circuit as shown in FIG. 7, and a similar timing diagram (not shown) would be generated for that circuit. In this case, the StartSystem and start signals would create dcomplete and d[ ] signals in accordance with the timing relationships illustrated in FIG. 7.

In general, the continuous measurement systems illustrated in FIGS. 3 and 4 work well if the frequencies stay within the acceptable range for $2^b$ clock cycles. With large counters this can be very limiting since there may be a long time between frequency updates. For example, in the case where b=10, there would be 1024 cycles in between each update based on a counter size (or width) of 1024 bits. For systems that expect to ramp frequency more quickly, an alternate circuit can be used. Under this alternative embodiment, instead of only using one measurement circuit, two or more measurement circuits are used for each of the f and d measurements, with each measurement circuit started at staggered times within a single counter period (e.g., 1024 cycles). Such a system comprises a staggered, cascaded, or parallel measurement scheme in which multiple frequency and/or detection interval updates are provided within each counter period so that frequent or virtually continuous updates of frequency and detection interval are provided to the periodic synchronizer.

Figure 8:
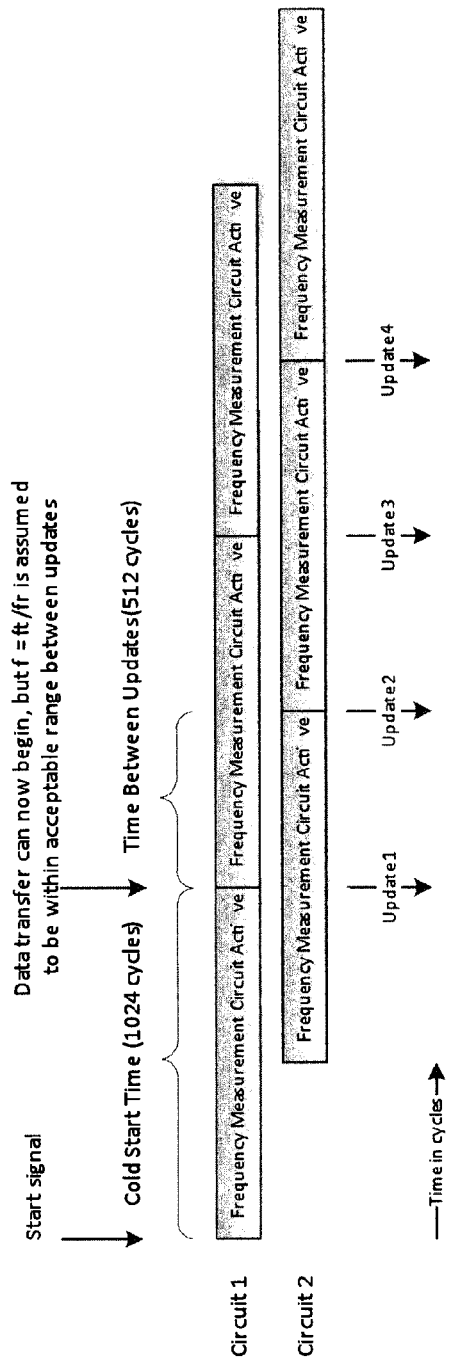
FIG. 8 illustrates a method of performing parallel frequency measurements, under an embodiment.

FIG. 8 illustrates a method of performing parallel frequency measurements, under an embodiment. In this embodiment, a plurality of frequency measurement circuits is employed to provide a number of frequency measurements during each $2^b$ time period. Diagram 800 illustrates a case in which two circuits, circuit 1 and circuit 2, provide frequency measurement updates during each 1024 cycle counter period (for the case where b=10). As shown in the FIG. 8, a start signal triggers circuit 1 to start its frequency measurement. Halfway or approximately halfway through its measurement cycle (512 cycles for b=10), circuit 2 then starts its respective frequency measurement. The result of the circuit 1 frequency measurement is denoted update 1, and the result of the circuit 2 measurement is denoted update 2. As can be seen from FIG. 8, this parallel overlapping frequency measurement scheme provides frequency updates (f) twice or approximately twice as often as the single frequency measurement case. In an embodiment, any practical number of frequency measurement cycles may be used to provide frequency measurement updates. For ease of implementation, $2^n$ circuits are typically used. In the case of four circuits, circuits 2, 3, and 4 would be configured to provide updates at ¼ the $2^b$ cycle time, e.g., 256, 512 and 768 cycles (assuming b=10, as shown). The update rate would then be n times more frequent than the rate provided by a single measurement circuit. Other numbers of circuits, other than 2, 4, 8, etc. may also be provided depending on system constraints and requirements.

FIG. 8 illustrates a parallel frequency measurement method utilizing two or more frequency measurement circuits, such as circuit 302 in FIG. 5 to provide continuous or near continuous frequency measurement updates. A similar scheme may be implemented to provide parallel detection interval measurements. In this scheme, two or more detection interval measurement circuits, such as circuit 402 in FIG. 6 would be used to provide continuous or near continuous detection interval measurement updates, in a similarly staggered arrangement. In this case, each of the frequency measurement circuit active times in circuits 1 and 2 would be denoted detection interval circuit active times and the updates (e.g., updates 1-4) would comprise updates of the detection interval (d).

With respect to FIG. 8, the embodiments illustrate one or more cases in which the frequency updates are uniform in respect to their start times within each counter period. That is, the updates are provided at 1/n intervals depending on how many measurement (frequency or detection) are provided. In an alternative embodiment, the updates may be provided at non-uniform update times.

Figure 9A:
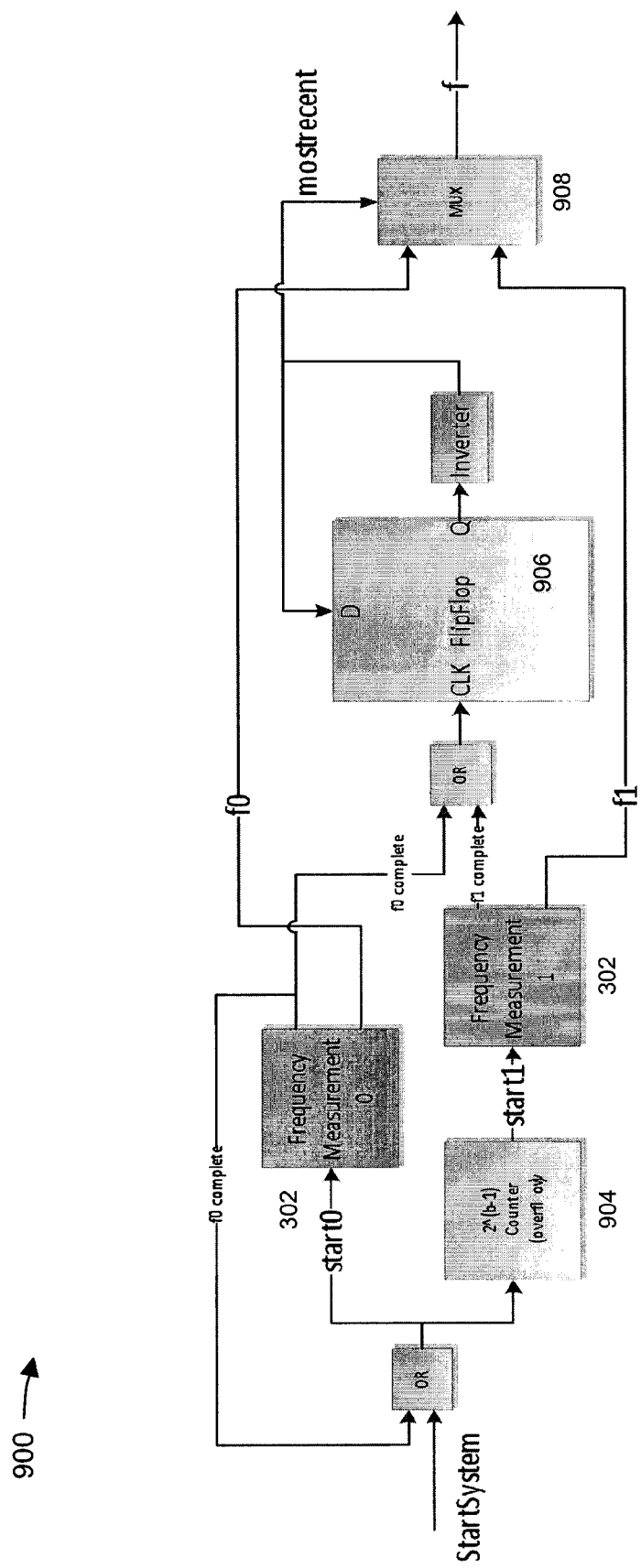
FIG. 9A illustrates a parallel continuous frequency measurement system, under some embodiments.

FIG. 9A illustrates a parallel continuous frequency measurement system, under some embodiments. System 900 illustrates a system for implementing the parallel frequency measurement method illustrated in FIG. 8. System 900 includes two frequency measurement circuits 302, denoted frequency measurement 0 and frequency measurement 1. Each frequency measurement circuit is triggered by a respective start signal (start0 and start1), which are in turn triggered by an input system start (StartSystem) signal. The start timing of frequency measurement 1 is controlled by counter 904, which in the case of FIG. 9A is configured to send the start1 signal at ½ the interval of frequency measurement counter. Each frequency measurement circuit 302 generates a respective frequency output f0 and f1, which are then provided as the frequency measurement update (f) from multiplexer 908. Appropriate latching 906 and logic circuits control the frequency updates from the two measurement circuits 302 based on the state of the respective f0 complete and f1 complete signals.

Figure 9B:
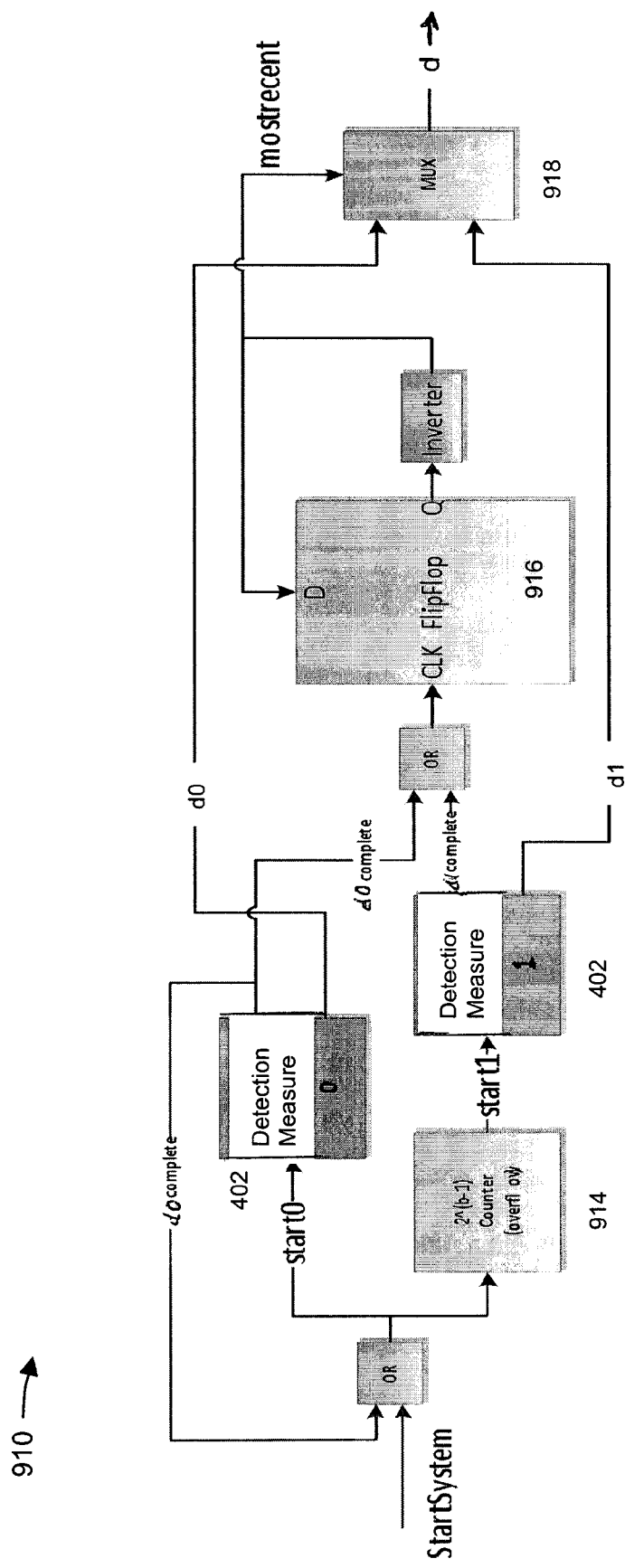
FIG. 9B illustrates a parallel continuous detection interval measurement system, under some embodiments.

FIG. 9A illustrates a parallel frequency measurement system utilizing two or more frequency measurement circuits 302 to provide continuous or near continuous frequency measurement updates. A similar system may be implemented to provide parallel detection interval measurements. FIG. 9B illustrates a parallel detection interval measurement system utilizing two or more detection interval measurement circuits 402 to provide continuous or near continuous detection interval measurement updates. System 910 includes two detection interval circuits 402, denoted detection measurement 0 and detection measurement 1. Each of these measurement circuits is triggered by a respective start signal (start0 and start1), which are in turn triggered by an input system start (StartSystem) signal. The start timing of frequency measurement 1 is controlled by counter 914. Each detection measurement circuit 402 generates a respective detection interval output d0 and d1, which are then provided as the detection interval measurement update (d) from multiplexer 918. Appropriate latching 916 and logic circuits control the detection interval updates from the two measurement circuits 402 based on the state of the respective d0 complete and d1 complete signals.

As shown in FIGS. 9A and 9B, two or more frequency and detection interval measurement circuits are cascaded and started at different times based on respective input counters. Any practical number of frequency measurement and/or detection interval measurement circuits may be used, depending on how frequently the (f) and (d) updates are required to provide relevant data to the periodic synchronizer 110. The greater the number of measurements circuits that are provided, the finer the granularity of update data, although there will generally be a proportionate increase in circuit complexity, as each additional measurement circuit includes an additional counter (904 or 914) to produce the additional start signals for each respective measurement circuit, and for the embodiments shown, each additional counter is half the size of the previous measurement circuit counter.

In an embodiment, each measurement circuit utilizes a counter that defines a start period based on the size of the counter. The counter is not configured to operate as a timer, but rather counts a constant number of cycles based on its size. For the frequency measurement circuit, the CR counter 501 acts as a stop circuit to provide the frequency update, and for the detection interval measurement circuit, the CD counter 603 acts as a stop circuit to provide the detection interval update. These counters may or may not be the same size, and the (f) and (d) updates may or may not be provided at the same rate. Both the f and d measurement circuits are triggered from the same clock, but the relevant stop counters may be of different sizes, thus producing different update rates. The update rate of each of the f and d measurements may be tailored based on counter size, and may be configured so that they update in a manner that provides the most relevant data to the synchronizer, while minimizing circuit complexity.

The embodiments of FIGS. 9A and 9B illustrate a case in which the frequency measurement circuits are embodied as circuit 302 of FIG. 5 and the detection interval measurement circuits are embodied as circuit 402 in FIG. 6. It should be noted that the frequency measurement and detection interval measurement circuits may be implemented using different circuits than shown in FIGS. 5 and 6 in alternate embodiments.

Figure 10:
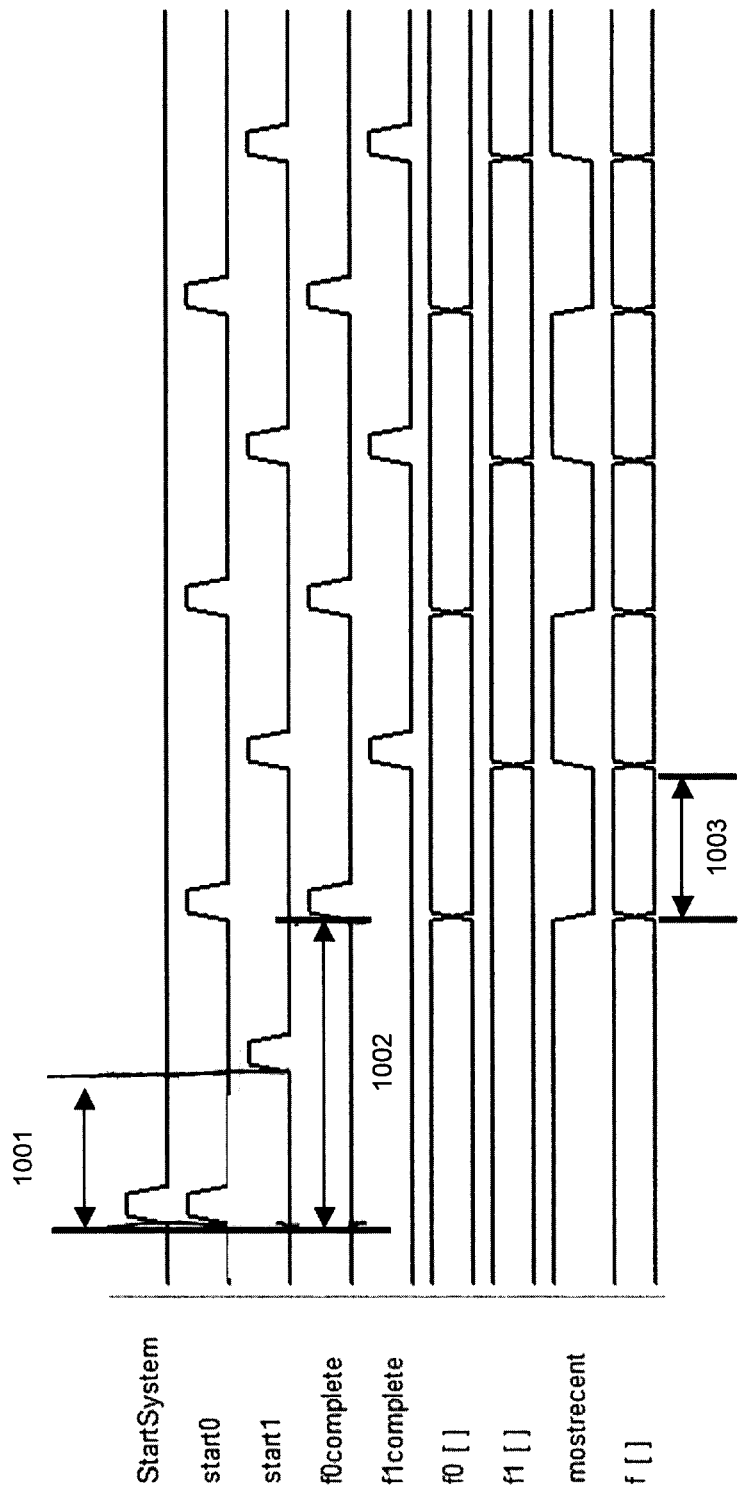
FIG. 10 illustrates a sample a timing diagram showing the operation of the circuit of FIG. 9A, under some embodiments.

FIG. 10 illustrates a sample a timing diagram showing the operation of of the circuit of FIG. 9A, under some embodiments. The timing diagram shown in FIG. 10 starts with a StartSystem pulse, which initiates the frequency measurement 0 circuit. This start pulse also enters a delay line (or modified counter) 904 which delays the start signal by half of the time required for a measurement circuit to get a new value measured in clock pulses. This delay time is shown by time interval 1001 in FIG. 10. After this delay, the frequency measurement 1 circuit is started. Eventually, frequency measurement 0 finishes, and the active time is shown by time interval 1002 in FIG. 10, and its output value is posted to f as the most recent line is pulled low. This completion causes start0 signal to be asserted, beginning the process all over again. After time interval 1003, frequency measurement 1 finishes. This parallel circuit allows for updates to occur twice as fast as the simple case involving a single frequency measurement circuit, doubling the maximum frequency ramp speed. As stated previously, this method could be used for any number of additional measurement circuits (e.g., three to eight circuits), eventually allowing for an updated measurement every clock cycle if desired and possible within circuit constraints.

The operation of the parallel detection interval measurement circuit 910 is analogous to that of the parallel frequency measurement circuit 900, and a similar timing diagram (not shown) would be generated for that circuit. In this case, the relevant start signals (StartSystem, start0, and start1) would produce outputs d0complete, d1complete, d0[ ], d1[ ], mostrecent, and d[ ], in the same manner as shown in FIG. 10 for the frequency updates.

In an embodiment, a scalable multi-stage frequency and detection interval measurement circuit may be implemented using a relatively large plurality of measurement circuits in which one or more stages may be gated during operation (on-the-fly) depending on speed requirements, power consumption, and other operating characteristics. For example, a four-stage frequency measurement circuit may be provided such that four frequency updates are provided during a single counter period. For fast frequency ramping in a frequency domain, all four frequency measurement circuits may be enabled by appropriate activation signals so that frequency updates are provided at ¼, ½, ¾ and 1/1 intervals. In the event that the frequency ramping is slow or power consumption is high, two measurement circuits may be de-activated or gated so that frequency updates are provided only at ½ and 1/1 intervals. In this embodiment a gate signal may be generated based on known or anticipated frequency ramp speed, power consumption, and/or temperature characteristics, or other operating parameters. Such a circuit can be configured to generate an appropriate gate signal to each of the measurement circuits based on defined operating parameters.

In a further alternative embodiment, the rate of updates (f and d) may be changed by dynamically altering the size of the appropriate stop counters. In most embodiments, the counters are implemented through successive flip-flop circuits to form a string of flip-flops. In an embodiment, a size circuit can be used to tap off any number of flip-flop circuits to create different size counters depending on measurement update type (f or d) or operating conditions.

Embodiments provide an advantage over present systems in that instead of waiting for large counters to overflow (often thousands of cycles), the parallel measurement systems of FIGS. 9A and 9B allow the predictive periodic synchronizer to continuously calculate new transmit/receive frequency ratios, with frequent updates based on a number of staggered frequency measurement circuits (frequency and detection interval). This removes any data latency during frequency changes. Such a continuous measurement scheme is particularly useful in modern SOC systems with the adoption of frequency ramping (such as in discrete GPUs), which makes this latency even more important to the speed of the whole system.

Embodiments of the continuous frequency measurement system allows the use of predictive synchronization with frequency ramping or systems with disparate frequency domains in which the frequencies in the different domains is not static. In general, synchronization is necessary whenever multiple clock domains need to communicate to each other, and predictive synchronization is the best way to get low latency data transfer between domains. Current systems have not efficiently accommodated frequency domains that feature dynamic frequency shifts, often requiring the use of brute force synchronizers and thus introducing excess latency back into the system. As frequency ramping and clock drift are being used in more and more SOCs, embodiments of a continuous frequency measurement system for predictive synchronizers, as described herein provides effective frequency updates for fast synchronization without incurring the latencies associated with brute force synchronizers.

Although embodiments have been described for use in relation to one or more types of predictive periodic synchronizers, it should be noted that such embodiments may also be used and/or modified for use with other types of predictive synchronizers to allow for them to work with changing frequencies as well.

For purposes of the present description, the terms "component," "module," "circuit," and "process," may be used interchangeably to refer to a circuit element or processing unit that performs a particular function. Such a function may be implemented purely in hardware or it may be implemented through computer program code (software), digital or analog circuitry, computer firmware, or any combination thereof.

It should be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media. Under some embodiments, the computer readable media may store program code or software instructions that are executed by a computer system and cause the computer system to perform at least some of the functions and processes of a method described herein.

Some embodiments are also directed to computer readable media comprising a data structure that is operated upon by a program executable on a computer system. The program operates on the data structure to perform a portion of a process to fabricate an integrated circuit including circuitry described by the data structure. The circuitry described in the data structure includes providing a method of taking a continuous frequency measurement of different domains in a heterochronous system in which the frequency in at least one domain of two different clock domains changes or varies at a rate exceeding a minimal frequency error range.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for continuously monitoring frequencies between transmit and receive clock domains, comprising:
    taking a series of frequency measurements generated by a first measurement loop that restarts itself whenever a previous frequency measurement is complete;
    taking a series of detection interval measurements generated by a second measurement loop that restarts itself whenever a previous detection interval measurement is complete; and
    providing the series of frequency measurements and the series of detection interval measurements to a phase estimator that provides an estimate of the transmit clock phase to a synchronizer arranged between the transmit and receive clock domains during a condition in which at least one of the transmit and receive clocks is actively ramped between two frequencies.

2. The method of claim 1, wherein the first measurement loop comprises a plurality of measurement cycles, each measurement cycle comprising a period between a present frequency measurement and the previous frequency measurement, the method further comprising:
    maintaining a receive counter to count clock cycles for the receive clock domain; and
    asserting a first done signal upon overflow of the receive counter, wherein an asserted first done signal indicates a completion of the each measurement cycle for the receive clock domain.

3. The method of claim 2 further comprising:
    maintaining a transmit counter to count clock cycles for the transmit clock domain; and
    asserting a second done signal upon overflow of the receive counter, wherein an asserted second done signal indicates a completion of the each measurement cycle for the transmit clock domain.

4. The method of claim 3 wherein the each measurement cycle is determined by a size of at least one of the receive counter and the transmit counter.

5. The method of claim 4 wherein the at least one of the receive counter and the transmit counter is a register of a bit-size b, and wherein the each measurement cycle is a cycle length of $2^b$ cycles.

6. The method of claim 1 wherein the synchronizer comprises a predictive synchronizer configured to synchronize data transferred from the transmit clock domain to the receive clock domain.

7. The method of claim 6 wherein the transmit and receive clock domains are heterochronous domains that operate at different clock frequencies wherein the clock frequencies differ from each other by a defined minimum frequency value, and wherein at least one of the frequencies of the transmit and receive clock domains varies over time due to at least one of a clock drift or the active ramping between the two frequencies.

8. The method of claim 1 wherein each detection interval measurement value comprises a time delay used in a phase detection circuit in terms of the transmit clock domain frequency.

9. The method of claim 8 further comprising providing even and odd edge detection values to the phase estimator circuit, wherein the phase estimator circuit derives an estimated phase of the transmit clock.

10. The method of claim 9 further comprising processing the estimated phase of the transmit clock and data transmitted from the transmit clock domain in an even/odd synchronizer to generate receive data synchronized to the receive clock domain frequency.

11. A circuit comprising:
- a frequency measurement circuit taking a series of frequency measurements generated by a first measurement loop that restarts itself whenever a previous frequency measurement is complete;
- a detection interval measurement circuit taking a series of detection interval measurements generated by a second measurement loop that restarts itself whenever a previous detection interval measurement is complete; and
- an interface providing the series of frequency measurements and the series of detection interval measurements to a phase estimator that provides an estimate of the transmit clock phase to a synchronizer arranged between the transmit and receive clock domains during a condition in which at least one of the transmit and receive clocks is actively ramped between two frequencies.

12. The circuit of claim 11 wherein the frequency measurement circuit comprises:
- a receive counter of bit size b to count clock cycles for the receive clock domain;
- a first component asserting a first done signal upon overflow of the receive counter, wherein an asserted first done signal indicates a completion of a measurement cycle for the receive clock domain;
- a transmit counter of bit size b to count clock cycles for the transmit clock domain; and
- a second component asserting a second done signal upon overflow of the receive counter, wherein an asserted second done signal indicates a completion of the measurement cycle for the transmit clock domain.

13. The circuit of claim 12 wherein the measurement cycle is a cycle length of $2^b$ cycles, the circuit further comprising:
- a trigger circuit receiving a start signal to initiate the taking of the first frequency measurement at a first frequency measurement time; and
- one or more delay circuits delaying the start signal to each of the subsequent frequency measuring circuits to initiate the taking of the subsequent frequency measurements at corresponding subsequent frequency measurement times, and wherein each delay circuit delay circuit delays a respective frequency measurement circuit by a factor of $2^{b-n}$ where n is a variable value from 1 to N, where N is the number of frequency measurement circuits.

14. The circuit of claim 11 further comprising the interface providing the continuous updates of the ratio of the transmit clock domain frequency to the receive clock domain frequency as a sequential plurality of frequency values to a phase estimator circuit.

15. The circuit of claim 14 wherein each detection interval measurement value comprises a time delay used in a phase detection circuit in terms of the transmit clock domain frequency, and wherein the phase estimator circuit receives even and odd edge detection values generated by an edge detector circuit and derives estimated phase data of the transmit clock based on the even and odd edge detection values and the plurality of frequency values and the plurality of detection interval measurement values.

16. The circuit of claim 15 further comprising an even/odd synchronizer coupled to the phase detection circuit and processing the estimated phase of the transmit clock and data transmitted from the transmit clock domain to generate receive data synchronized to the receive clock domain frequency.

* * * * *